US012795880B2

(12) United States Patent
Oike et al.

(10) Patent No.: US 12,795,880 B2
(45) Date of Patent: Nov. 10, 2026

(54) DISPENSATION MANAGEMENT DEVICE

(71) Applicant: FUJI CORPORATION, Chiryu (JP)

(72) Inventors: Hiroshi Oike, Chiryu (JP); Go Uchida, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 303 days.

(21) Appl. No.: 18/725,898

(22) PCT Filed: Jan. 20, 2022

(86) PCT No.: PCT/JP2022/002027

§ 371 (c)(1),
(2) Date: Jul. 1, 2024

(87) PCT Pub. No.: WO2023/139730

PCT Pub. Date: Jul. 27, 2023

(65) Prior Publication Data

US 2025/0107058 A1 Mar. 27, 2025

(51) Int. Cl.
*H05K 13/08* (2006.01)

(52) U.S. Cl.
CPC .................................. *H05K 13/086* (2018.08)

(58) Field of Classification Search
CPC .................................................. H05K 13/086
See application file for complete search history.

(56) References Cited

U.S. PATENT DOCUMENTS 10,373,643 B2 * 8/2019 Toritani ................ G06F 3/0682
2006/0200264 A1 9/2006 Kodama et al.
2015/0271925 A1 * 9/2015 Mori ................... H05K 13/085 29/832

FOREIGN PATENT DOCUMENTS

WO WO 2005/009101 A1 1/2005

OTHER PUBLICATIONS

International Search Report mailed on Mar. 22, 2022 in PCT/JP2022/002027 filed on Jan. 20, 2022, therein, 2 pages.

* cited by examiner

*Primary Examiner* — Michael Collins
(74) *Attorney, Agent, or Firm* — Oblon, McClelland, Maier & Neustadt, L.L.P.

(57) ABSTRACT

A dispensation management device of the present disclosure manages dispensing of a component in an automatic warehouse in which multiple components are stored and the component is dispensed as necessary in one or multiple production lines including multiple component mounters which are arranged in a conveyance direction of a board and each of which loads the board via a buffer configured to temporarily store the board and mounts the component. In a case where dispensing of multiple components used in different component mounters is necessary, the dispensation management device determines a dispensing order of the multiple components based on a retention amount of the board retained in front of each of the multiple component mounters.

7 Claims, 7 Drawing Sheets

Fig. 6A

D

| DISPENSING ORDER | REEL | COMPONENT MOUNTER | PRODUCTION LINE | TIME |
|---|---|---|---|---|
| 1 | REEL 40A | COMPONENT MOUNTER 10A | PRODUCTION LINE L1 | ○○:○○:○○ |
| 2 | REEL 40B | COMPONENT MOUNTER 10B | PRODUCTION LINE L2 | ○○:○○:×× |

Fig. 6B

D

| DISPENSING ORDER | REEL | COMPONENT MOUNTER | PRODUCTION LINE | TIME |
|---|---|---|---|---|
| 1 | REEL 40A | COMPONENT MOUNTER 10A | PRODUCTION LINE L1 | ○○:○○:○○ |
| 2 | REEL 40B | COMPONENT MOUNTER 10B | PRODUCTION LINE L2 | ○○:○○:×× |
| 3 | REEL 40C | COMPONENT MOUNTER 10C | PRODUCTION LINE L3 | ○○:○○:□□ |

Fig. 6C]

D

| DISPENSING ORDER | REEL | COMPONENT MOUNTER | PRODUCTION LINE | TIME |
|---|---|---|---|---|
| 1 | REEL 40C | COMPONENT MOUNTER 10C | PRODUCTION LINE L3 | ○○:○○:□□ |
| 2 | REEL 40A | COMPONENT MOUNTER 10A | PRODUCTION LINE L1 | ○○:○○:○○ |
| 3 | REEL 40B | COMPONENT MOUNTER 10B | PRODUCTION LINE L2 | ○○:○○:×× |

Fig. 6D

D

| DISPENSING ORDER | REEL | COMPONENT MOUNTER | PRODUCTION LINE | TIME |
|---|---|---|---|---|
| 1 | REEL 40C | COMPONENT MOUNTER 10C | PRODUCTION LINE L3 | ○○:○○:□□ |
| 2 | REEL 40B | COMPONENT MOUNTER 10B | PRODUCTION LINE L2 | ○○:○○:×× |
| 3 | REEL 40A | COMPONENT MOUNTER 10A | PRODUCTION LINE L1 | ○○:○○:○○ |

DISPENSATION MANAGEMENT DEVICE

TECHNICAL FIELD

The present description discloses a dispensation management device.

BACKGROUND ART

Conventionally, there has been known a management device that determines an order in which an operator performs work for a component mounter constituting a production line. For example, Patent Literature 1 discloses a management device that derives an expected time of component shortage and determines a priority order of supply work by a worker based on the derived expected time of the component shortage. An operator obtains a reel around which a tape holding the component is wound from an electronic component storage location according to the priority order.

PATENT LITERATURE

Patent Literature 1: WO2005/009101A

BRIEF SUMMARY

Technical Problem

In some cases, an automatic warehouse is adopted as an electronic component storage location. The automatic warehouse executes automatic dispensing of reels according to a priority order determined by a management device. In the automatic warehouse, the reels are taken out from the internal storage location of the reels, and the reels are conveyed to a take-out port. Therefore, in the automatic warehouse, it takes a certain amount of time to dispense one reel. Therefore, when a component shortage advance notice is concentrated on many component mounters, a waiting time until the component is dispensed becomes long, and the component shortage occurs at the same time in multiple component mounters or production lines, and there is a possibility that the production efficiency deteriorates.

A main object of the present disclosure is to suppress deterioration of production efficiency even when it is necessary to dispense multiple components used in different component mounters.

Solution to Problem

According to the present disclosure, there is provided a dispensation management device for managing dispensing of a component in an automatic warehouse in which multiple components are stored and the component is dispensed as necessary in one or multiple production lines including multiple component mounters which are arranged in a conveyance direction of a board and each of which loads the board via a buffer configured to temporarily store the board and mounts the component, in which in a case where dispensing of multiple components used in different component mounters is necessary, a dispensing order of the multiple components is determined based on a retention amount of the board retained in front of each of the multiple component mounters.

In the dispensation management device, in a case where the dispensing of the multiple components used in different component mounters is necessary, the dispensing order of the multiple components is determined based on the retention amount of the board retained in front of each of the multiple component mounters. The retention amount of the board retained in front of the component mounter indicates a production bias of the board in the component mounter. Therefore, by determining the dispensing order in consideration of the production bias, it is possible to suppress the interruption of the production due to the component waiting and suppress the deterioration of the production efficiency.

BRIEF DESCRIPTION OF DRAWINGS

FIG. 6A is a diagram of dispensing order data D.

FIG. 6B is a diagram of dispensing order data D.

FIG. 6C is a diagram of dispensing order data D.

FIG. 6D is a diagram of dispensing order data D.

DESCRIPTION OF EMBODIMENTS

Figure 1:
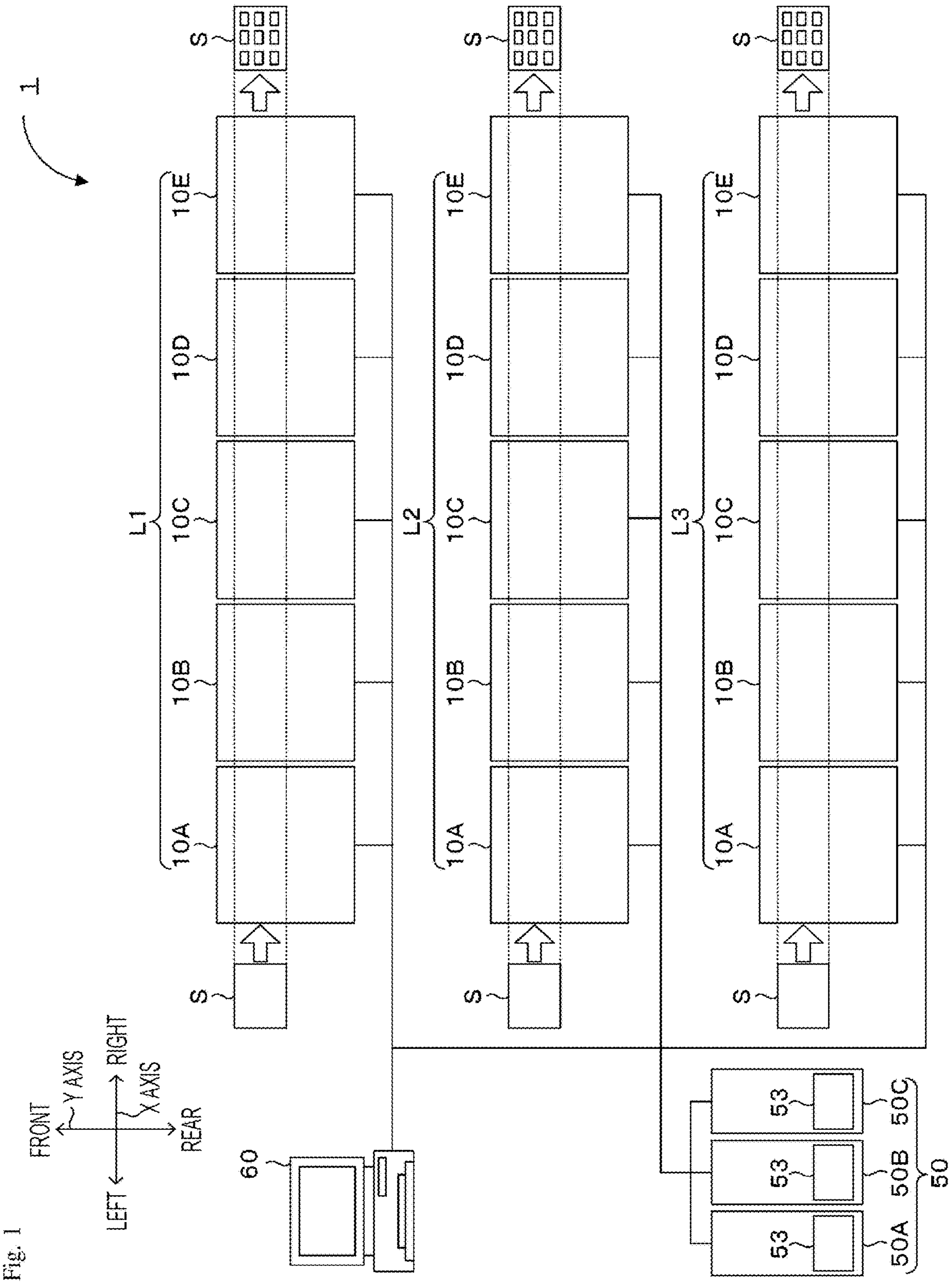
FIG. 1 is a schematic view of component mounting system 1.
Figure 2:
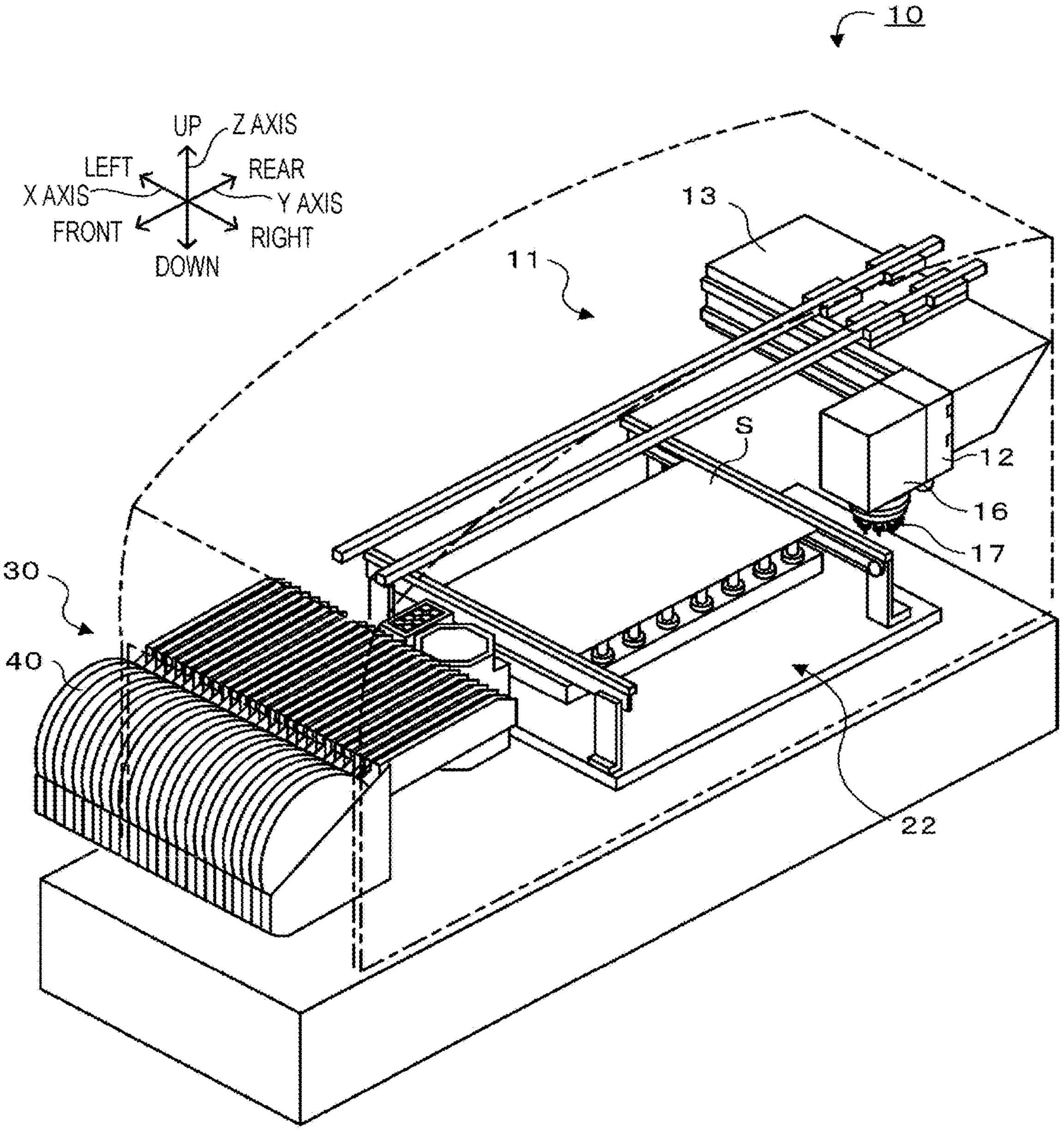
FIG. 2 is a perspective view of component mounter 10.
Figure 3:
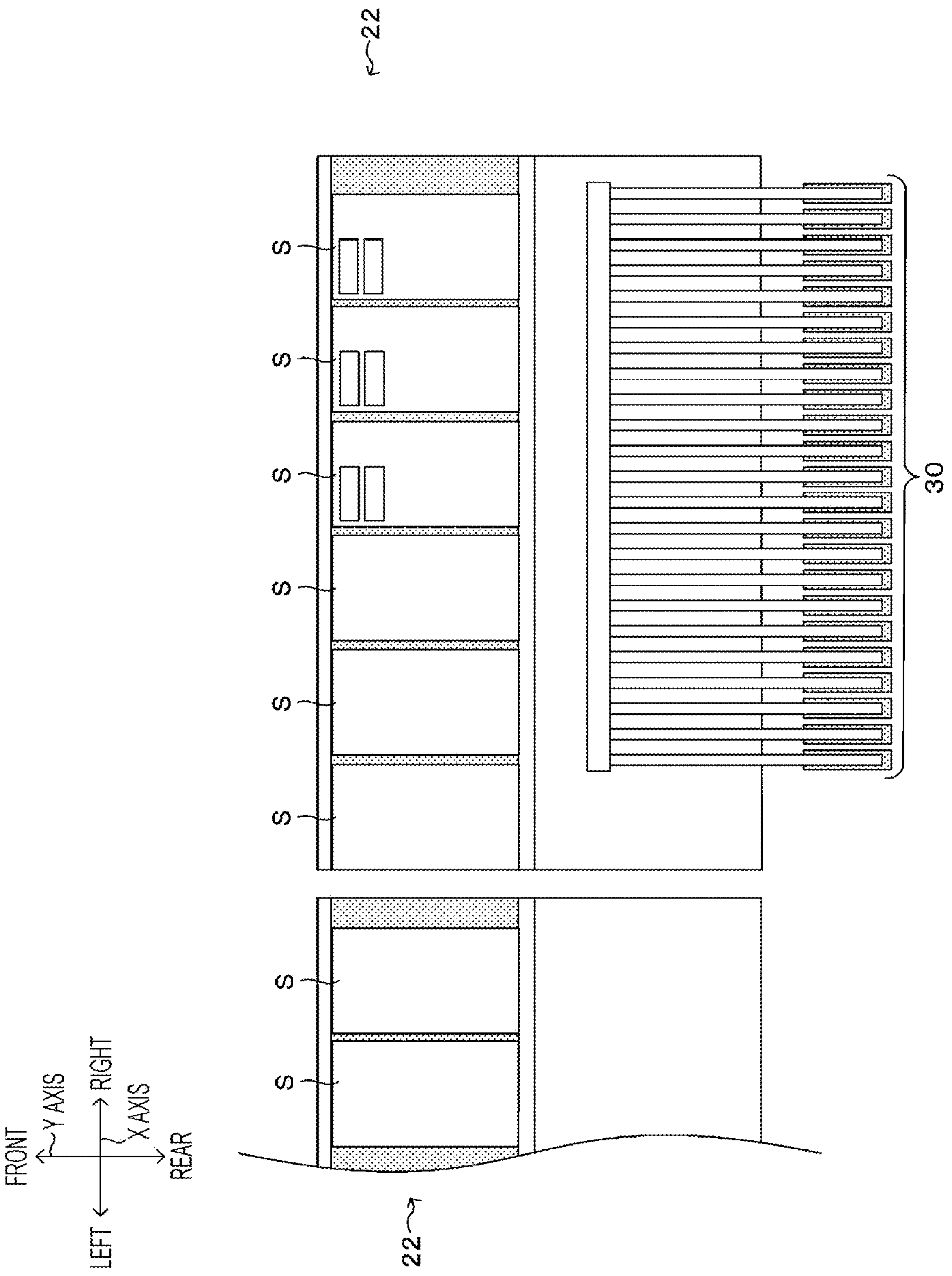
FIG. 3 is a plan view of board conveyance device 22.
Figure 4:
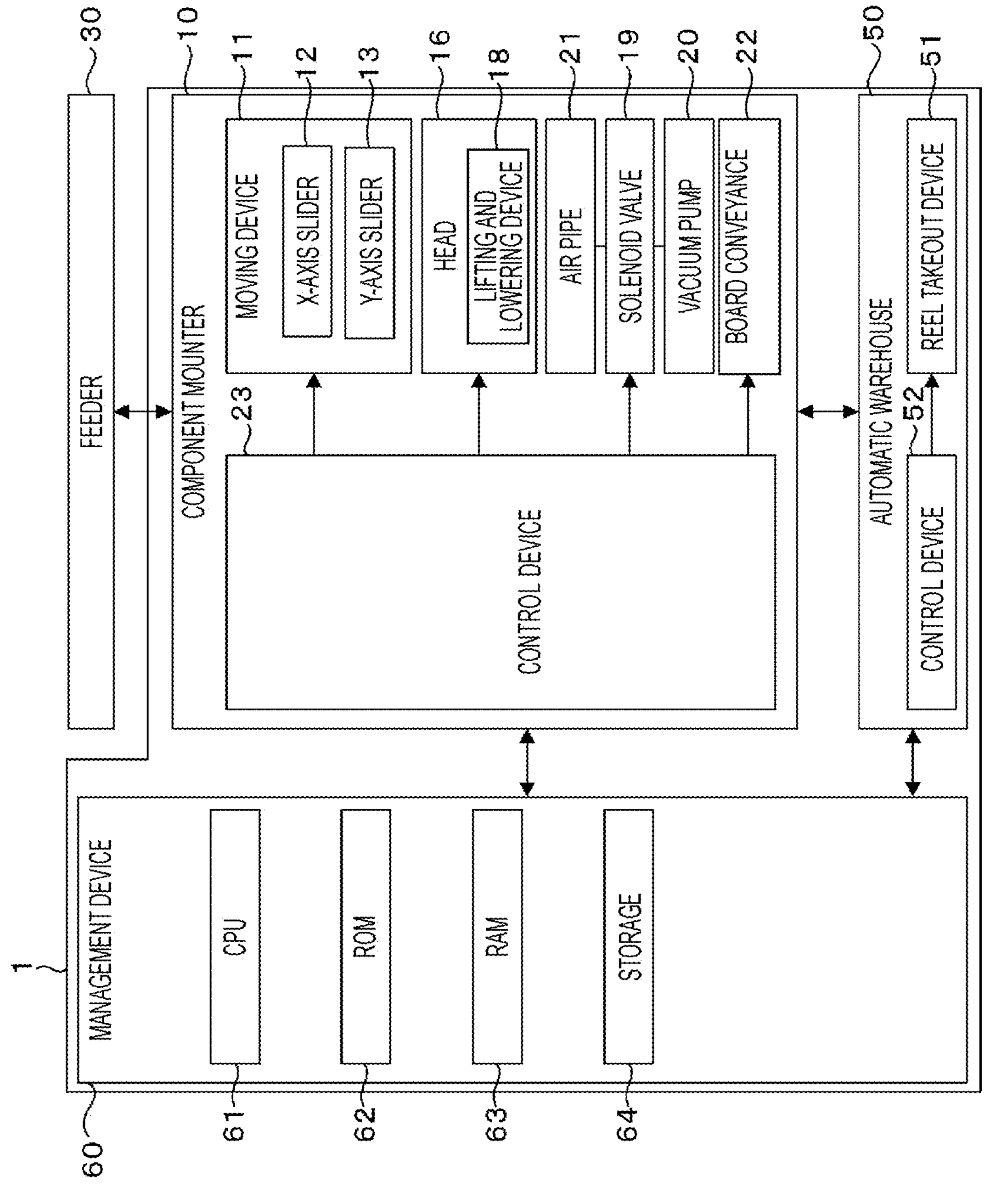
FIG. 4 is a block diagram illustrating an electric connection relationship of component mounting system 1.

A preferred embodiment of the present disclosure will be described below with reference to the accompanying drawings. FIG. 1 is a schematic view of component mounting system 1. FIG. 2 is a perspective view of component mounter 10. FIG. 3 is a plan view of board conveyance device 22. FIG. 4 is a block diagram illustrating an electric connection relationship of component mounting system 1. A left-right direction illustrated in FIGS. 1 to 3 is an X-axis direction, a front-rear direction illustrated in FIGS. 1 to 3 is a Y-axis direction, and an up-down direction (direction perpendicular to a paper surface in FIGS. 1 and 3) illustrated in FIG. 2 is a Z-axis direction.

Component mounting system 1 produces board S on which a component is mounted. As illustrated in FIG. 1, component mounting system 1 includes multiple (three in the present embodiment) production lines L (L1, L2, and L3), multiple (three in the present embodiment) automatic warehouses 50 (50A, 50B, and 50C), and management device 60.

Each production line L includes multiple (five in the present embodiment) component mounters 10 (10A, 10B, 10C, 10D, and 10E) arranged in a conveyance direction of board S. In addition, production line L includes a printing machine that prints solder on board S, a print inspection machine that inspects a state of the solder printed by the printing machine, a reflow device that heats board S to melt the solder, and then cools board S to electrically connect components on board S, and fixes the components to board S, and the like. Component mounter 10 is a device that receives a supply of a component from feeder 30 and mounts the component on board S. As illustrated in FIG. 2, component mounter 10 includes moving device 11, head 16, board conveyance device 22, and control device 23 (see FIG. 4). In addition, component mounter 10 includes a suction nozzle stocker that stocks suction nozzle 17, a board fixing device that fixes board S loaded by board conveyance device 22 at a predetermined fixed position, and the like.

Moving device 11 is a device that moves head 16 in a horizontal direction. Moving device 11 includes Y-axis slider 13 extending in the X-axis direction and slidable in the Y-axis direction, and X-axis slider 12 provided to be slidable in the X-axis direction with respect to Y-axis slider 13.

Head 16 is a member capable of holding multiple suction nozzles 17. Head 16 is attached to a front side of X-axis slider 12. Therefore, head 16 moves in the X-axis direction as X-axis slider 12 moves in the X-axis direction, and moves in the Y-axis direction as Y-axis slider 13 moves in the Y-axis direction. Head 16 includes lifting and lowering device 18 (see FIG. 4) that vertically moves suction nozzle 17 with respect to head 16. A suction port of suction nozzle 17 selectively communicates with any one of vacuum pump 20 (see FIG. 4) and air pipe 21 (see FIG. 4) via solenoid valve 19 (see FIG. 4). Each suction nozzle 17 is capable of applying a negative pressure to the suction port to pick up a component by driving solenoid valve 19 such that the suction port communicates with vacuum pump 20, and is capable of applying a positive pressure to the suction port to release the picking up of the component by driving solenoid valve 19 such that the suction port communicates with air pipe 21.

Board conveyance device 22 is a device that conveys board S in the X-axis direction (from left to right in FIGS. 1 to 3). Board conveyance device 22 is configured as, for example, a belt conveyor device. As illustrated in FIG. 3, a length of board conveyance device 22 in the X-axis direction is a length capable of temporarily retaining multiple (five in the present embodiment) boards S in addition to board S (for example, third board S from a downstream side (right side) in board conveyance device 22 on the downstream side (right side) illustrated in FIG. 3) fixed at a predetermined fixed position. The amount by which board S can be temporarily retained in board conveyance device 22 is determined by the length of board conveyance device 22 in the X-axis direction and the size of board S.

Control device 23 is configured as a microprocessor mainly including CPU, and controls entire component mounter 10. Control device 23 outputs control signals to moving device 11, lifting and lowering device 18, and solenoid valve 19. Control device 23 is communicably connected to control device 23 of another component mounter 10, management device 60, and control device 52 of automatic warehouse 50.

Feeder 30 is a device that supplies components to component mounter 10. Feeder 30 pulls out a component supply tape from reel 40 and conveys the component supply tape to a predetermined component supply position. Reel 40 is formed by winding a component supply tape. The component supply tape is obtained by attaching a cover tape onto a carrier tape in which a component is accommodated in each of multiple recessed portions. Feeder 30 includes a control device (not illustrated) that controls entire feeder 30. Feeder 30 is set on a feeder setting table provided in component mounter 10. When feeder 30 is set on the feeder setting table, the control device of feeder 30 is communicably connected to control device 23 of component mounter 10.

Automatic warehouse 50 is a storage device that stores reels 40 and automatically dispenses reels 40 in response to a dispensing request input from management device 60. Automatic warehouse 50 includes a holding section, reel takeout device 51 (see FIG. 4), and control device 52 (see FIG. 4). The holding section is, for example, a member having a shelf on which multiple reels 40 can be placed. Reel takeout device 51 is a device that conveys reel 40 held by the holding section to dispensing outlet 53 of automatic warehouse 50. Control device 52 is communicably connected to control device 23 of component mounter 10 and management device 60.

As illustrated in FIG. 4, management device 60 is a computer including CPU 61, ROM 62, RAM 63, and storage (for example, an HDD or an SSD) 64. Management device 60 stores a production program (job data) of board S and the like. The production program of board S is a program that defines, for each type (board type) of board S, which component type of the component is mounted in which order, how many components on which board S is mounted are produced, and the like. Management device 60 is communicably connected to control device 23 of component mounter 10 and control device 52 of automatic warehouse 50, and exchanges control signals and data with each other.

Next, an operation of component mounting system 1 configured in this way will be described. First, a component mounting process executed by component mounter 10 will be described. This process is executed by control device 23 of each component mounter 10 after a mounting start instruction is input from management device 60.

When this process is started, control device 23 controls board conveyance device 22 so that board S is loaded to a predetermined fixed position. Subsequently, after confirming that board S has been conveyed to the fixed position, control device 23 controls the board fixing device so that board S is fixed. Next, control device 23 controls X-axis slider 12 and Y-axis slider 13 so that suction nozzle 17 moves directly above the component which is a mounting target. Next, control device 23 controls the driving of lifting and lowering device 18 so that suction nozzle 17 is lowered and abuts on the component which is a pickup target. Control device 23 drives and controls lifting and lowering device 18 and solenoid valve 19 so that the component which is the pickup target is picked up. Subsequently, control device 23 controls the driving of X-axis slider 12 and Y-axis slider 13 so that suction nozzle 17 picking up the component moves to a component mounting position on board S. Next, control device 23 controls lifting and lowering device 18 and solenoid valve 19 so that the components are mounted on board S. Control device 23 controls the board fixing device so that the fixing of the board is released after confirming that all the components to be mounted by the own device are mounted on the board. Then, control device 23 controls board conveyance device 22 so that board S is conveyed to the downstream side. Control device 23 repeatedly executes the above-described processing until a predetermined number of boards S are produced.

Next, remaining component number management processing will be described. The number of remaining components is the number of components remaining on reel 40 held by each of multiple feeders 30 set in each component mounter 10. The number of remaining components is used in a dispensation management routine described later. This processing is always executed by CPU 61 of management device 60 while the component mounting process described above is being executed by component mounter 10. When feeder 30 is set, component mounter 10 acquires feeder information including the ID (feeder ID and component ID), the component type, and the number of remaining components from feeder 30, and transmits the feeder information to management device 60. CPU 61 of management device 60 receives the feeder information and stores the feeder information in storage 64. Therefore, management device 60 stores the number of components accommodated in reel 40 that supplies components to each component mounter 10 at the start of the component mounting process in storage 64 in advance.

When this processing is started, CPU 61 first waits until a carry-out signal is input from control device 23 of any component mounter 10. The carry-out signal is a signal indicating that component mounter 10 has conveyed board S to the downstream side. Control device 23 outputs the carry-out signal to management device 60 every time board S on which the component is mounted by the own device is conveyed to the downstream side. Upon receiving the carry-out signal, CPU 61 updates the number of remaining components. Specifically, CPU 61 acquires the type and the number of components mounted on one board S by component mounter 10 from the production program of board S, and subtracts the number of components mounted on board S by component mounter 10 that outputs the carry-out signal from the number of remaining components before update of reel 40 that supplies the components to component mounter 10 that outputs a conveyance signal. Then, CPU 61 stores the updated number of remaining components in storage 64.

Next, retention amount management processing will be described. This processing is always executed by CPU 61 of management device 60 while the component mounting process described above is being executed by component mounter 10. The retention amount is, for example, the number of boards S between a fixed position of board conveyance device 22 and a position before a fixed position of board conveyance device 22 adjacent to board conveyance device 22 on an upstream side. This retention amount is used in the dispensation management routine described later. The retention amount of the board retained in board conveyance device 22 of each component mounter 10 is stored in storage 64. At the start of the component mounting, the retention amount of board retained in board conveyance device 22 of each component mounter 10 is zero.

When this routine is started, CPU 61 determines component mounter 10 that derives the retention amount of board S in front. Next, CPU 61 reads the production quantity (hereinafter, production quantity α) of board S in component mounter 10. The production quantity is derived for each type of board S. The production quantity is zero when the production of boards S is started in component mounter 10. Further, every time CPU 61 inputs the carry-out signal from component mounter 10, CPU 61 counts up the production quantity by one, derives the production quantity of boards S, and stores the derived production quantity in storage 64. Subsequently, the production quantity (hereinafter, production quantity β of boards S in component mounter 10 adjacent to component mounter 10 on the upstream side is read. Then, CPU 61 derives the difference between the production quantity β and the production quantity a as the retention amount of board S in front of component mounter 10, and stores the difference in storage 64. CPU 61 derives the retention amount in all component mounters 10 of each production line L.

Figure 5:
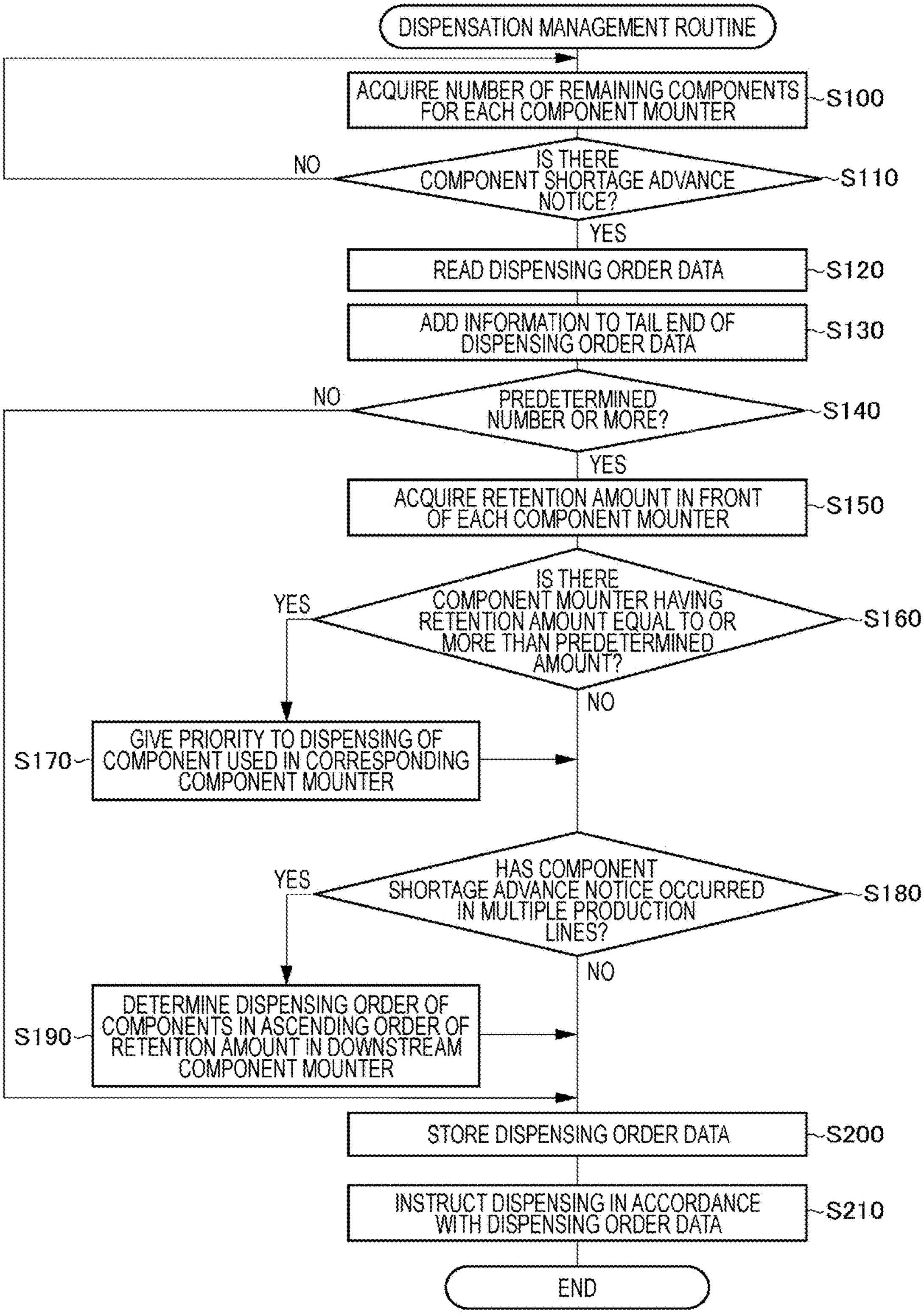
FIG. 5 is a flowchart illustrating an example of a dispensation management routine.
Figure 7:
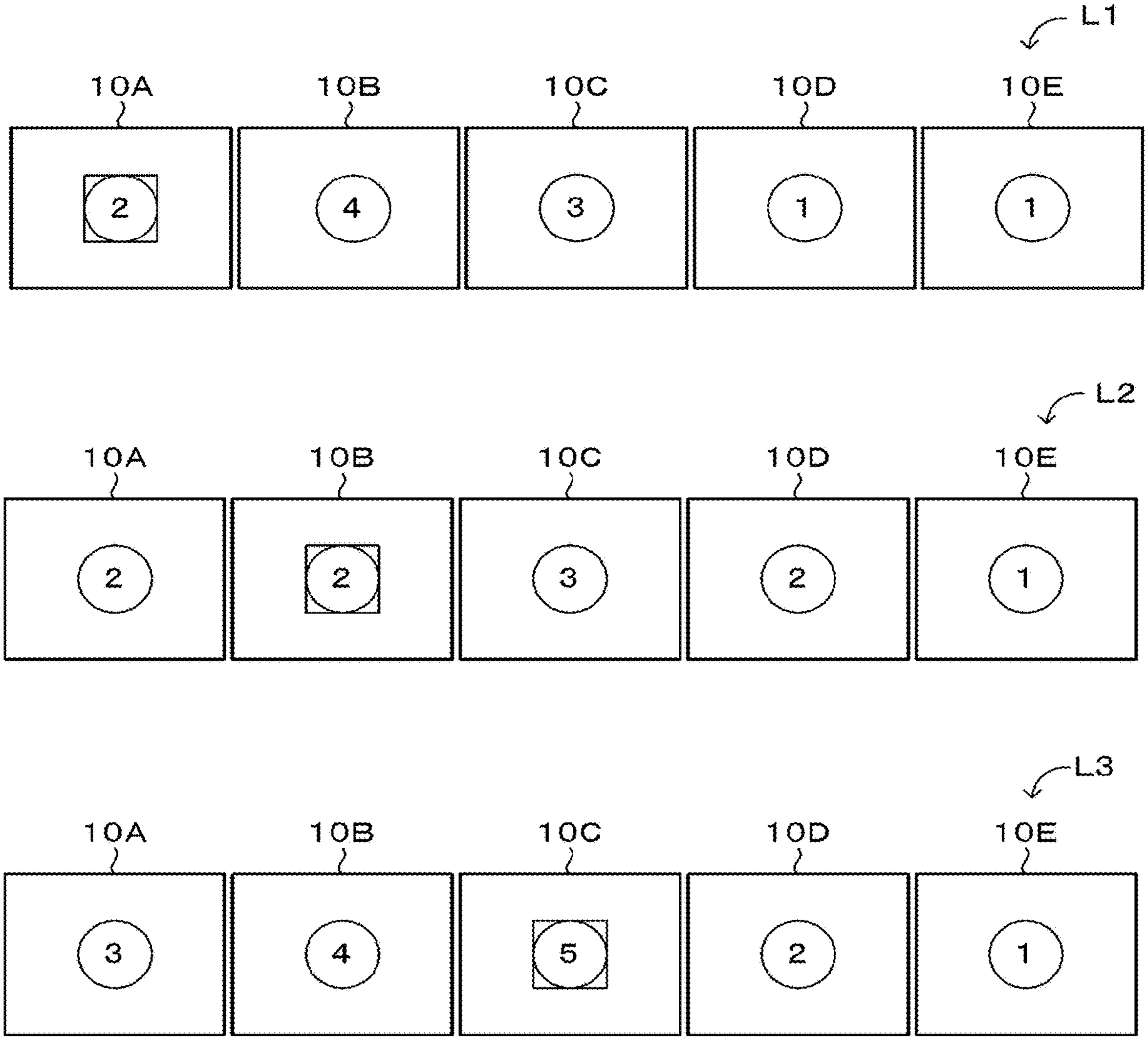
FIG. 7 is a diagram illustrating a method of determining a dispensing order of reels 40.

Next, dispensation management processing will be described with reference to FIGS. 5 to 7. FIG. 5 is a flowchart illustrating an example of the dispensation management routine. FIGS. 6A to 6D are diagrams illustrating dispensing order data D. FIG. 7 is a diagram illustrating a method of determining a dispensing order of reels 40. This routine is always executed by CPU 61 of management device 60 while production line L is operating.

When this routine is started, first, CPU 61 reads the number of remaining components of each reel 40 for each production line L and for each component mounter 10 (S100). The number of remaining components is obtained by the above-described remaining component number management processing. Next, CPU 61 determines whether a component shortage is predicted (a component shortage advance notice is generated) within a predetermined time based on the number of remaining components (S110). Specifically, a negative determination is made when there are no reels 40 whose number of remaining components is equal to or less than a predetermined number, and an affirmative determination is made when there are reels 40 whose number of remaining components is equal to or less than the predetermined number. In a case where the negative determination is made in S110, CPU 61 returns to S100 again. Meanwhile, when the affirmative determination is made in S110, CPU 61 determines that it is necessary to newly supply a component (to newly dispense a component (reel 40 accommodating the component) from automatic warehouse 50).

Subsequently, CPU 61 reads dispensing order data D of the component (reel 40) from storage 64 (S120). Dispensing order data D read by CPU 61 is data indicating the order in which reels 40 waiting for dispensing are dispensed from automatic warehouse 50 at the current time point. In dispensing order data D, the dispensing order of the component (reel 40), the type of reel to be dispensed, component mounter 10 in which the component shortage advance notice has occurred, production line L including component mounter 10, and the time at which the component shortage advance notice has occurred are stored in association with each other. FIG. 6A illustrates an example of dispensing order data D read from storage 64 by CPU 61. Dispensing order data D of reels 40 stored in storage 64 is obtained by CPU 61 executing this routine at a time point going back by a predetermined time from the current time point.

Then, CPU 61 adds, to the tail end of dispensing order data D of reel 40 read in S120, information related to the component determined to need to be newly supplied in S120. An example of dispensing order data D of reel 40 at this time is illustrated in FIG. 6B.

Next, CPU 61 determines whether the number of reels 40 waiting for the dispensation in the updated dispensing order data D is a predetermined number or more (S140). Here, the predetermined number is, for example, three.

When an affirmative determination is made in S140, CPU 61 reads the retention amount of board S retained in front of component mounter 10 for each production line L (S150). The retention amount is derived by the above-described retention amount management processing. Then, CPU 61 determines whether the component shortage advance notice has occurred in component mounter 10 in which the retention amount of board S is equal to or more than the predetermined amount (S160). Here, the predetermined amount may be one or more, for example, five.

When an affirmative determination is made in S160, CPU 61 executes processing for giving priority to the dispensing of the component (reel 40) used in component mounter 10 in which the board of the predetermined amount or more is retained over the dispensing of the components (reels 40) used in the other component mounters 10 (S170). A state when this processing is executed will be described with reference to FIG. 7. In FIG. 7, three component mounters 10 marked with squares are component mounters 10 in which the component shortage advance notice has occurred. In addition, in FIG. 7, a number in a circle mark is a retention amount of board S in front of component mounter 10. In FIG. 7, three component mounters 10 marked with squares are the same as component mounters 10 stored in dispensing order data D illustrated in FIG. 6B. In the case illustrated in FIG. 7, CPU 61 determines which of component mounters 10 for which the component shortage advance notice has occurred, priority should be given to dispensing the component (reel 40) used by component mounter 10. In component mounter 10C of production line L3, the retention amount of board S is a predetermined amount or more (five or more), and in component mounter 10A of production line L1 and component mounter 10B of production line L2, the retention amount of board S is less than the predetermined amount (less than five). Therefore, CPU 61 determines that the dispensing order of the components (reels 40C) used in component mounter 10C of production line L3 is prioritized over the dispensing order of the components (reels 40) used in other component mounters 10. Then, CPU 61 updates dispensing order data D such that the dispensing order of the component (reel 40C) used in component mounter 10C of production line L3 is the highest. An example of updated dispensing order data D is illustrated in FIG. 6C. In a case where there are multiple component mounters 10 in which the retention amount of board S is equal to or larger than the predetermined amount, CPU 61 sets the dispensing order higher for the earlier time when the component shortage advance notice occurs.

Meanwhile, after a negative determination is made in S160 or after S170, CPU 61 determines whether a component shortage advance notice has occurred in component mounters 10 of multiple different production lines L (S180).

When an affirmative determination is made in S180, CPU 61 executes processing for preferentially dispensing the component (reel 40) used in the production line in which the retention amount of board S retained in the downstream component mounter 10 is small among the components (reels 40) whose dispensing order is not determined (S190). Specifically, CPU 61 specifies the maximum retention amount for each production line L. The maximum retention amount is the maximum retention amount among the retention amounts in front of component mounter 10 on the downstream side of component mounter 10 in which the component shortage advance notice has occurred. Then, CPU 61 executes processing for giving priority to dispensing of the component (reel 40) used in production line L having a small maximum retention amount. A state when this processing is executed will be described with reference to FIG. 7. In the case illustrated in FIG. 7, CPU 61 determines which component (reel 40) of the component (reel 40A) used in component mounter 10A of production line L1 and the component (reel 40B) used in component mounter 10B of production line L2 is prioritized for the dispensing. This is because the dispensing order of the component (reel 40C) used in component mounter 10C of production line L3 among the components (reels 40) used in component mounter 10 in which the component shortage advance notice has occurred is already determined. In production line L1, the maximum retention amount is four (the retention amount of board S retained in front of component mounter 10B). Meanwhile, the maximum retention amount in production line L2 is three (the retention amount of board S retained in front of component mounter 10C). Therefore, CPU 61 determines that the dispensing order of the components (reels 40B) used in component mounter 10B of production line L2 is prioritized over the dispensing order of the components (reels 40A) used in component mounter 10A of production line L1. Then, CPU 61 updates dispensing order data D such that the dispensing order of the components (reels 40B) used in component mounter 10B of production line L2 is higher than the dispensing order of the components (reels 40A) used in component mounter 10A of production line L1. The updated dispensing order data D is illustrated in FIG. 6D. In a case where the retention amount on the downstream side is the same, CPU 61 sets the dispensing order higher for the earlier time when the component shortage advance notice occurs.

After a negative determination is made in S140, after a negative determination is made in S180, or after S190, CPU 61 stores dispensing order data D of reels 40 in storage 64 (S200). Then, CPU 61 outputs a dispensing request to automatic warehouse 50 (50A, 50B, or 50C) that stores the necessary components (reels 40) in accordance with dispensing order data D (S210). When there are multiple automatic warehouses 50 and there is automatic warehouse 50 in which reel takeout device 51 has not performed the dispensing operation of reels 40 at the current time point, CPU 61 outputs the dispensing request to automatic warehouse 50. In any one of automatic warehouses 50, when reel takeout device 51 performs a take-out operation of reel 40, CPU 61 confirms that the take-out operation has been completed in any one of automatic warehouses 50 in which the take-out operation has been performed, and then outputs the dispensing request to automatic warehouse 50 in which the take-out operation has been completed. Then, information related to the component that is the target of the dispensing request is deleted from dispensing order data D, and the routine is ended. After the dispensing request of the component (reel 40) is input, control device 52 of automatic warehouse 50 controls reel takeout device 51 of automatic warehouse 50 so that reel 40 requested to be dispensed is dispensed.

Here, a correspondence relationship between the elements of the present embodiment and the elements of the present disclosure will be clarified. Management device 60 of the present embodiment corresponds to a dispensation management device of the present disclosure, component mounters 10A to 10E correspond to multiple component mounters, a region other than a region where board S is fixed in board conveyance device 22 corresponds to a buffer, and production lines L1 to L3 correspond to multiple production lines.

In management device 60 described above, when it is necessary to dispense multiple components to be used in different component mounters 10, the dispensing order of the multiple components is determined based on the retention amount of board retained in front of each of multiple component mounters 10. The retention amount of the board retained in front of component mounter 10 indicates a production bias of the board in component mounter 10. Therefore, by determining the dispensing order in consideration of the production bias, it is possible to suppress the interruption of the production due to the component waiting and suppress the deterioration of the production efficiency.

In addition, in management device 60, the dispensing order of the multiple components is determined such that, among the multiple components that need to be dispensed, the component used in component mounter 10 in which a predetermined amount or more of boards are retained in front is preferentially dispensed over the component used in component mounter 10 in which a predetermined amount or more of boards S are not retained in front. Component mounter 10 that retains a predetermined amount or more of boards in front is component mounter 10 serving as a bottle neck in production line L. Accordingly, when priority is given to the dispensing of the components used in component mounter 10, it is possible to suppress the interruption of the production due to the waiting of the components in component mounter 10 serving as the bottle neck and to suppress the deterioration of the production efficiency.

In addition, when production line L includes multiple production lines L1 to L3 each including multiple component mounters 10A to 10E, and it is necessary to dispense the multiple components used in component mounters 10 of different production lines L, the dispensing order of the multiple components is determined based on the retention amount of board S for each production line L. The retention amount of boards S in each production line L represents the production bias of the board in production line L. Therefore, by determining the dispensing order in consideration of the production bias, it is possible to suppress the interruption of the production due to the component waiting and suppress the deterioration of the production efficiency. In addition, the dispensing order of the multiple components is determined such that the component to be used in production line L in which the retention amount of board retained in predetermined component mounter 10 downstream of component mounter 10 requiring the supply of the component is smaller is preferentially dispensed. Production line L is production line L in which, when component mounter 10 interrupts the production, board S that can be produced by component mounter 10 on the downstream side thereof disappears quickly. Therefore, the component used in production line L is preferentially dispensed.

In addition, in management device 60, a case where it is necessary to dispense the component is a case where the component shortage is expected in component mounter 10. Since the production is stopped when there is the component shortage in component mounter 10, it is particularly significant to apply management device 60.

In addition, management device 60 determines the dispensing order between the component waiting for dispensing and the new component when dispensing of the new component becomes necessary in a state where the component waiting for dispensing remains. Therefore, it is easy to preferentially dispense the component to be preferentially dispensed at all times.

The present disclosure is not limited to the embodiment that has been described heretofore at all, and needless to say, the present disclosure may be carried out in various modes without departing from the technical scope thereof.

In the above-described embodiment, the dispensation management device of the present disclosure has been described as management device 60. However, the dispensation management device of the present disclosure may be control device 23 of component mounter 10 or control device 52 of automatic warehouse 50.

In the above-described embodiment, CPU 61 executes the processing of S160 to S190 before executing the processing of S200. However, in the dispensation management routine, after executing the processing of S150, CPU 61 may execute the processing of S180 without executing the processing of S160 and S170. Alternatively, after CPU 61 performs the negative determination in S160 or after S170, CPU 61 may execute the processing of S200 without executing the processing of S180 and S190.

In the above-described embodiment, in S170 of the dispensation management routine, in a case where there are multiple component mounters 10 in which a predetermined amount or more of boards S are retained in front, CPU 61 sets the dispensing order of component mounter 10 having the earlier time at which the component shortage advance notice occurs to be higher. However, the dispensing order may be set to be higher for a component (reel 40) used in component mounter 10 having a larger retention amount in front, and when the retention amounts are the same, the dispensing order may be set to be higher in order of the earlier occurrence time of the component shortage advance notice.

In the above-described embodiment, in S190 of the dispensation management routine, CPU 61 specifies the maximum retention amount of board S retained on the downstream side of component mounter 10 in which the component shortage advance notice has occurred for each production line L, and gives priority to dispensing of the component used in production line L having a small maximum retention amount. However, CPU 61 may specify the retention amount in front of component mounter 10 adjacent to component mounter 10 in which the component shortage advance notice has occurred on the downstream side and set the dispensing order higher for the component (reel 40) used in production line L in which the specified retention amount is smaller. Alternatively, CPU 61 may derive the total amount of the retention amounts of boards S in all component mounters 10 disposed downstream of component mounter 10 in which the component shortage advance notice has occurred and set the dispensing order higher for the component (reel 40) used in production line L in which the total amount of the retention amount is smaller.

In the above-described embodiment, the retention amount is the number of boards S retained in component mounter 10. However, the retention amount may be set to the time required for component mounter 10 to produce board S retained in front. In this case, the time obtained by multiplying the number of boards S retained in front by the time required for producing one board in component mounter 10 needs only be derived as the time required for producing board S in component mounter 10.

In the above-described embodiment, the buffer of the present disclosure is a region other than a board fixing region in board conveyance device 22. However, a buffer device may be provided between component mounters 10 in addition to board conveyance device 22.

INDUSTRIAL APPLICABILITY

The present disclosure can be used in the field of manufacturing a component mounter or the like.

REFERENCE SIGNS LIST

1: component mounting system, 10, 10A, 10B, 10C, 10D, 10E: component mounter, 11: moving device, 12X: X-axis slider, 13Y: Y-axis slider, 16: head, 17: suction nozzle, 18: lifting and lowering device, 19: solenoid valve, 20: vacuum pump, 21: air pipe, 22 board conveyance device, 23: control device, 30: feeder, 40: reel, 40A: reel, 40B: reel, 40C: reel, 50, 50A, 50B, 50C: automatic warehouse, 51: reel takeout device, 52: control device, 53: dispensing outlet, 60: management device, 61: CPU, 62: ROM, 63: RAM, 64: storage, L, L1, L2, L3: production line, S: board

The invention claimed is:

1. A dispensation management device for managing dispensing of a component in an automatic warehouse in which multiple components are stored and the component is dispensed as necessary in one or multiple production lines including multiple component mounters which are arranged in a conveyance direction of a board and each of which loads the board via a buffer configured to temporarily store the board and mounts the component, wherein in a case where dispensing of multiple components used in different component mounters is necessary, a dispensing order of the multiple components is determined based on a retention amount of the board retained in front of each of the multiple component mounters.

2. The dispensation management device according to claim 1, wherein the dispensing order of the multiple components is determined such that, among the multiple components that need to be dispensed, a component used in a component mounter in which a predetermined amount or more of boards are retained in front is preferentially dispensed over a component used in a component mounter in which the predetermined amount or more of boards are not retained in front.

3. The dispensation management device according to claim 1, wherein the production line includes multiple production lines each including the multiple component mounters, and in a case where dispensing of multiple components used in the component mounters of different production lines is necessary, a dispensing order of the multiple components is determined based on a retention amount of the board for each production line.

4. The dispensation management device according to claim 3, wherein the dispensing order of the multiple components is determined such that a component to be used in a production line in which a retention amount of a board retained in a predetermined component mounter downstream of a component mounter requiring supply of the component is smaller is preferentially dispensed.

5. The dispensation management device according to claim 1, wherein the retention amount is the number of boards retained in front of the component mounter or a time required for the component mounter to produce the boards retained in front of the component mounter.

6. The dispensation management device according to claim 1, wherein a case where dispensing of the component is necessary is a case where component shortage is expected within a predetermined time in the component mounter.

7. The dispensation management device according to claim 1, wherein in a case where dispensing of a new component becomes necessary in a state where a component waiting for dispensing remains, a dispensing order between the component waiting for dispensing and the new component is determined.

* * * * *